(12) United States Patent
Hase et al.

(10) Patent No.: US 10,340,442 B2
(45) Date of Patent: Jul. 2, 2019

(54) MAGNETORESISTIVE ELEMENT AND MAGNETIC MEMORY

(71) Applicant: Kabushiki Kaisha Toshiba, Minato-ku (JP)

(72) Inventors: Naoki Hase, Shinagawa (JP); Takao Ochiai, Funabashi (JP); Tadaomi Daibou, Yokohama (JP); Yushi Kato, Chofu (JP); Shumpei Omine, Meguro (JP); Junichi Ito, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/445,608

(22) Filed: Feb. 28, 2017

(65) Prior Publication Data
US 2017/0170389 A1    Jun. 15, 2017

Related U.S. Application Data

(63) Continuation of application No. PCT/JP2015/081814, filed on Nov. 12, 2015.

(30) Foreign Application Priority Data

Nov. 19, 2014   (JP) .................................. 2014-234956

(51) Int. Cl.
*G11C 11/16*     (2006.01)
*H01L 27/22*     (2006.01)
(Continued)

(52) U.S. Cl.
CPC ............ *H01L 43/02* (2013.01); *G11C 11/161* (2013.01); *G11C 11/1673* (2013.01);
(Continued)

(58) Field of Classification Search
CPC ......... H01L 43/02; H01L 43/08; H01L 43/10; G11C 11/14–11/16; G11C 11/161
See application file for complete search history.

(56) References Cited

U.S. PATENT DOCUMENTS 8,223,533 B2    7/2012   Ozeki et al.
8,502,331 B2    8/2013   Kitagawa et al.
(Continued)

FOREIGN PATENT DOCUMENTS

JP     2010-232447    10/2010
JP     2012-64903     3/2012
(Continued)

OTHER PUBLICATIONS

International Search Report dated Feb. 2, 2016 in PCT/JP2015/081814, filed on Nov. 12, 2015.

*Primary Examiner* — Allison Bernstein
(74) *Attorney, Agent, or Firm* — Oblon, McClelland, Maier & Neustadt, L.L.P.

(57) ABSTRACT

A magnetoresistive element according to an embodiment includes: a first magnetic layer; a second magnetic layer; and a first nonmagnetic layer disposed between the first magnetic layer and the second magnetic layer, wherein the second magnetic layer includes a magnetic material containing at least one element selected from a first group consisting of Mn, Fe, Co, and Ni; at least one element selected from a second group consisting of Ru, Rh, Pd, Ag, Os, Ir, Pt, and Au; and at least one element selected from a third group consisting of Eu, Gd, Tb, Dy, Ho, Er, Tm, Yb, and Lu.

8 Claims, 9 Drawing Sheets

(51) Int. Cl.
  *H01L 43/08* (2006.01)
  *H01L 43/10* (2006.01)
  *H01L 43/02* (2006.01)
(52) U.S. Cl.
  CPC ........ *G11C 11/1675* (2013.01); *H01L 27/228* (2013.01); *H01L 43/08* (2013.01); *H01L 43/10* (2013.01)

(56) References Cited

U.S. PATENT DOCUMENTS

| | | |
|---|---|---|
| 8,520,433 B1 | 8/2013 | Kato et al. |
| 8,669,628 B2 | 3/2014 | Ueda et al. |
| 8,790,798 B2 | 7/2014 | Shukh |
| 2013/0001714 A1 | 1/2013 | Nishiyama et al. |
| 2013/0001717 A1* | 1/2013 | Zhou ................. H01F 10/3286 257/421 |
| 2013/0009259 A1 | 1/2013 | Watanabe et al. |
| 2013/0056812 A1* | 3/2013 | Kim ..................... H01L 27/101 257/295 |
| 2013/0069182 A1 | 3/2013 | Ohsawa et al. |
| 2014/0124884 A1 | 5/2014 | Watanabe et al. |
| 2015/0171317 A1 | 6/2015 | Watanabe et al. |
| 2016/0380029 A1 | 12/2016 | Hase et al. |

FOREIGN PATENT DOCUMENTS

| | | |
|---|---|---|
| JP | 2013-16542 | 1/2013 |
| JP | 2013-16560 | 1/2013 |
| JP | 2013-16643 | 1/2013 |
| JP | 2013-69788 | 4/2013 |
| JP | 2013-197406 | 9/2013 |
| JP | 2013-251336 | 12/2013 |
| JP | 2015-176933 | 10/2015 |
| JP | 2016-63150 | 4/2016 |

* cited by examiner

MAGNETORESISTIVE ELEMENT AND MAGNETIC MEMORY

CROSS REFERENCE TO RELATED APPLICATIONS

This application is a continuation of International Application No. PCT/JP2015/081814, filed on Nov. 12, 2015, which is based upon and claims the benefit of priority from the prior Japanese Patent Application No. 2014-234956, filed on Nov. 19, 2014, the entire contents of which are incorporated herein by reference.

FIELD

Embodiments of the present invention relate to magnetoresistive elements and magnetic memories.

BACKGROUND

A magnetic tunnel junction (MTJ) element as a magnetoresistive element has a stack structure that includes a storage layer having a changeable magnetization direction, a reference layer having a pinned magnetization direction, and an insulating layer disposed between the storage layer and the reference layer. This MTJ element is known to have a tunneling magnetoresistive (TMR) effect, and is used as the storage element of a memory cell in a magnetic random access memory (MRAM).

An MRAM stores information ("1" or "0") depending on changes in the relative angle between the magnetization directions of the magnetic layers in each MTJ element, and is nonvolatile. As the magnetization switching speed is several nanoseconds, high-speed data writing and high-speed data reading can be performed. In view of this, MRAMs are expected to be next-generation high-speed nonvolatile memories. Further, where a technique called spin transfer torque magnetization switching is used to control magnetization with a spin polarization current, the cell size in an MRAM is reduced so that the current density can be increased. With this, the magnetization of each storage layer can be readily reversed, and a high-density MRAM that consumes less power can be formed.

To increase the density of a nonvolatile memory, a higher degree of magnetoresistive element integration is essential. However, the thermal stability of the magnetic material forming a magnetoresistive element becomes lower with decrease in device size. Therefore, the issue is to improve the magnetic anisotropy and the thermal stability of such a magnetic material.

To counter this problem, MRAMs have recently been formed with perpendicular MTJ elements in which the magnetization directions of the magnetic materials are perpendicular to the film surfaces. Each magnetic material forming a perpendicular MTJ element has a perpendicular magnetic anisotropy. To achieve a perpendicular magnetic anisotropy, a material having a crystal magnetic anisotropy or an interface magnetic anisotropy is selected. For example, FePt, CoPt, and FePd are materials each having a high crystal magnetic anisotropy. Other than the above, there has been a report on an MTJ element that uses MgO as the tunnel barrier layer and a material having an interface perpendicular magnetic anisotropy, such as CoFeB.

The storage layer and the reference layer of an MTJ element each contain a magnetic material, and generate a magnetic field outward. Normally, in a perpendicular magnetization MTJ element in which, the storage layer and the reference layer each have a perpendicular magnetic anisotropy, the magnetic field leakage from the reference layer is larger than that in an in-plane magnetization MTJ element in which the magnetizations of the magnetic materials are parallel to the film surfaces. Also, the storage layer having a lower coercive force than that of the reference layer is greatly affected by the magnetic field leakage from the reference layer. Specifically, due to the influence of the magnetic field leakage from the reference layer, a shift occurs in the magnetization switching field of the storage layer, and the thermal stability becomes lower.

To reduce the magnetic field leakage from the reference layer toward the storage layer in a perpendicular magnetization MTJ element, the following measures have been suggested. The saturation magnetization of the reference layer is lowered, and a magnetic layer (a shift adjustment layer) having such a magnetization direction as to cancel the magnetization of the reference layer is employed.

DETAILED DESCRIPTION

Figure 1:
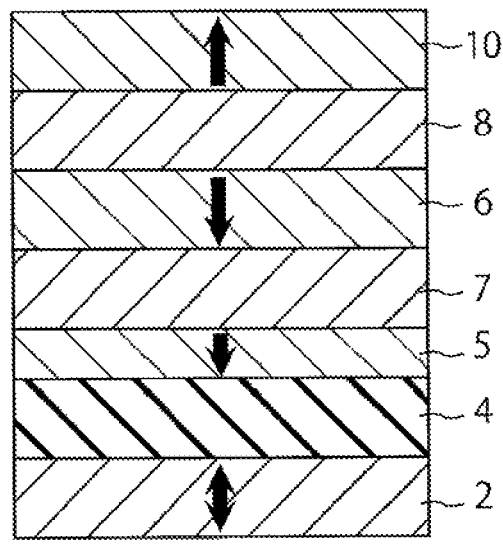
FIG. 1 is a cross-sectional view of a magnetoresistive element according to a first embodiment.

A magnetoresistive element according to an embodiment includes: a first magnetic layer; a second magnetic layer; and a first nonmagnetic layer disposed between the first magnetic layer and the second magnetic layer, wherein the second magnetic layer includes a magnetic material containing at least one element selected from a first group consisting of Mn, Fe, Co, and Ni; at least one element selected from a second group consisting of Ru, Rh, Pd, Ag, Os, Ir, Pt, and Au; and at least one element selected from a third group consisting of Eu, Gd, Tb, Dy, Ho, Er, Tm, Yb, and Lu.

The following is a description of embodiments, with reference to the accompanying drawings. In the description below, components with like functions and structures are denoted by like reference numerals, and the same explanation will be repeated only where necessary.

First Embodiment

FIG. 1 shows a cross-section of a magnetoresistive element according to a first embodiment. A magnetoresistive element 1 of the first embodiment is an MTJ element having a single-pin structure. This magnetoresistive element 1 has a stack structure that includes: a storage layer 2 containing a magnetic material; an interfacial magnetic layer 5 containing a magnetic material; a reference layer 6 containing a magnetic material: a nonmagnetic layer 4 interposed between the storage layer 2 and the interfacial magnetic layer 5; a functional layer 7 interposed between the interfacial magnetic layer 5 and the reference layer 6; a shift adjustment layer 10 that is disposed on the opposite side of the reference layer 6 from the functional layer 7 and contains a magnetic material; and an antiferromagnetic coupling layer 8 interposed between the reference layer 6 and the shift adjustment layer 10. That is, the magnetoresistive element 1 of the first embodiment has a stack structure formed by stacking the storage layer 2, the nonmagnetic layer 4, the interfacial magnetic layer 5, the functional layer 7, the reference layer 6, the antiferromagnetic coupling layer 8, and the shift adjustment layer 10 in this order (a stack structure formed by stacking the layers in the direction from the storage layer 2 toward the shift adjustment layer 10 in FIG. 1).

(Modification)

Figure 2:
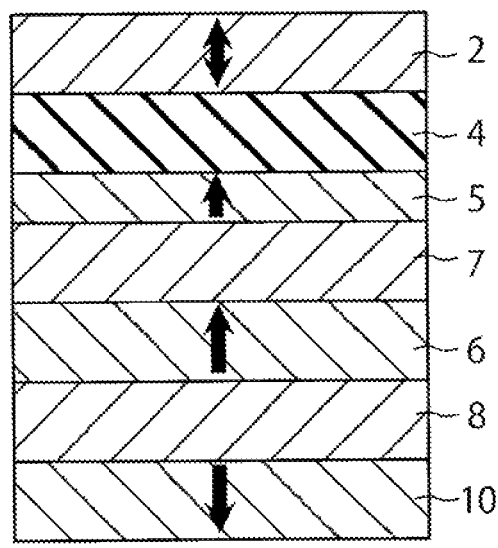
FIG. 2 is a cross-sectional view of a magnetoresistive element according to a modification of the first embodiment.

Alternatively, as in a magnetoresistive element 1A according to a modification of the first embodiment shown in FIG. 2, the stack structure may be formed by stacking the shift adjustment layer 10, the antiferromagnetic coupling layer 8, the reference layer 6, the functional layer 7, the interfacial magnetic layer 5, the nonmagnetic layer 4, and the storage layer 2 in this order. That is, in the modification shown in FIG. 2, the stack structure is formed by stacking the layers in the reverse order of the stacking order shown in FIG. 1.

In the magnetoresistive element 1 of the first embodiment and the magnetoresistive element 1A of the modification, the storage layer 2, the interfacial magnetic layer 5, the reference layer 6, and the shift adjustment layer 10 each have a perpendicular magnetic anisotropy. That is, each of these magnetoresistive elements is a perpendicularly magnetized MTJ element in which the magnetization direction of each layer containing a magnetic material is perpendicular to the film surface (or includes a component perpendicular to the film surface). Here, the "film surface" means the upper surface of each layer. For example, "the direction perpendicular to the film surface" means the stacking direction in the stack structure including the storage layer and the reference layer.

The storage layer 2 is a layer containing a magnetic material with a magnetization direction that can be reversed by the action of spin-polarized electrons. The storage layer 2 is formed with a single material of at least one element selected from a group of magnetic transition elements (the group consisting of Mn, Fe, Co, or Ni), an alloy containing at least one element selected from the above group of magnetic transition elements, or an alloy containing at least one element selected from the above group of magnetic transition elements and at least one element selected from a group of nonmagnetic elements (the group consisting of B, Al, Si, Ti, V, Cr, Ga, Ge, or Bi, for example). As used herein, a phrase referring to "at least one of" a list of items refers to any combination of those items, including a single member. As an example, "at least one of: a, b, or c" is intended to cover a, b, c, a-b, a-c, b-c, and a-b-c."

The interfacial magnetic layer 5 is formed with a single material of one element selected from a group of magnetic transition elements (the group consisting of Mn, Fe, Co, or Ni), an alloy containing a least one element selected from the above group of magnetic transition elements, a compound (such as FeB or CoFeB) of at least one element selected from the above group of magnetic transition elements and boron (B), an alloy (such as MnGa or $Mn_3Ge$) containing at least one element selected from the above group of magnetic transition elements and at least one nonmagnetic element selected from a group of nonmagnetic elements (the group consisting of Al, Si, Ti, V, Cr, Ga, or Ge), a Heusler alloy (such as $Co_2FeMnSi$), or the like.

The reference layer 6 and the functional layer 7 are the layers serving as the keys to this embodiment. To reduce the leakage magnetic field to be applied to the storage layer 2, the magnetic field leakage from the reference layer 6 is reduced, or the functional layer 7 is designed to reduce the magnetic field leakage from the reference layer 6 or the interfacial magnetic layer 5. A preferred tunneling magnetoresistive ratio (TMR ratio) should be achieved while the leakage magnetic field is reduced as above. These aspects will be described later in detail.

The shift adjustment layer 10 is formed with an alloy (such as $Sm_2Co_{17}$) containing at least one element selected from a group of magnetic transition elements (the group consisting of Mn, Fe, Co, or Ni) and at least one element selected from a group of rare-earth elements (the group consisting of Y, La, Ce, Pr, Nd, Sm, Eu, Gd, Tb, Dy, Ho, Er, Tm, Yb, or Lu), or an alloy (such as FePt, CoPt, or CoPd) containing at least one element selected from the above group of magnetic transition elements and at least one element selected from a group of noble metal elements (the group consisting of Ru, Rh, Pd, Os, Ir, Pt, Au, or Ag). To reduce the influence of a leakage magnetic field on the storage layer 2, the shift adjustment layer 10 has a magnetization configuration oriented in the opposite direction from the magnetization of the reference layer 6, or a magnetization configuration antiparallel to the magnetization of the reference layer 6.

The nonmagnetic layer 4 is formed with an oxide containing at least one metal element selected from a group of metal elements (the group consisting of Mg, Al, Ca, Ti, Cr, Fe, Cu, Zn, Nb, or Sr).

Inserted between magnetic layers, the antiferromagnetic coupling layer 8 causes antiferromagnetic interlayer exchange coupling between these magnetic layers. The antiferromagnetic coupling layer 8 is formed with a single material containing one metal element selected from the group consisting of Ru, Rh, and Ir, an alloy containing at least one 3d transition element selected from the group consisting of Mn, Cr, or Fe, or an alloy containing the above metal element and the above 3d transition element, for example. An alloy such as IrMn, PtMn, FeMn, or FeRh is used as an alloy containing a 3d transition element. Alternatively, the antiferromagnetic coupling layer 8 may contain at least one element selected from a group of rare-earth elements (the group consisting of Y, La, Ce, Pr, Nd, Sm, Eu, Gd, Tb, Dy, Ho, Er, Tm, Yb, or Lu).

(Write Method)

A method of writing information (data) into the magnetoresistive element of the first embodiment or any of the magnetoresistive elements of the embodiments described below is now described.

First, in a case where the magnetization direction of the storage layer 2 is to be switched from an antiparallel direction to a parallel direction with respect to the magnetization direction of the reference layer 6, the electronic current flowing in the opposite direction from the electrical current is made to flow from the shift adjustment layer 10 toward the storage layer 2. In this case, electrons that have passed through the reference layer 6 and the interfacial magnetic layer 5 are spin-polarized. The spin-polarized electrons flow into the storage layer 2 via the nonmagnetic layer 4. The electrons that have flowed into the storage layer 2 apply a spin torque to the magnetization of the storage layer 2, and cause the magnetization direction of the storage layer 2 to become parallel to the magnetization direction of the interfacial magnetic layer 5. In this manner, the magnetization direction of the storage layer 2 becomes parallel to the magnetization direction of the interfacial magnetic layer 5.

In a case where the magnetization direction of the storage layer 2 is to be switched from a parallel direction to an antiparallel direction with respect to the magnetization direction of the interfacial magnetic layer 5, the electronic current is made to flow from the storage layer 2 toward the shift adjustment layer 10. In this case, electrons that have passed through the storage layer 2 are spin-polarized. The spin-polarized electrons flow toward the interfacial magnetic layer 5 via the nonmagnetic layer 4. Of the spin-polarized electrons, the electrons having spins in the same direction as the magnetization direction of the interfacial magnetic layer 5 pass through the interfacial magnetic layer 5. On the other hand, the electrons having spins in the opposite direction from the magnetization direction of the interfacial magnetic layer 5 are reflected by the interface between the nonmagnetic layer 4 and the interfacial magnetic layer 5, and flow into the storage layer 2 via the nonmagnetic layer 4. The electrons that have flown into the storage layer 2 apply a spin torque to the magnetization of the storage layer 2, and cause the magnetization direction of the storage layer 2 to become antiparallel to the magnetization direction of the interfacial magnetic layer 5. In this manner, the magnetization direction of the storage layer 2 becomes antiparallel to the magnetization direction of the interfacial magnetic layer 5.

(Read Method)

Next, a method of reading information (data) from the magnetoresistive element of the first embodiment or any of the magnetoresistive elements of the embodiments described below is now described.

In reading information from the magnetoresistive element 1, a read current is made to flow from one of the storage layer 2 and the shift adjustment layer 10 toward the other, and the voltage or the current at both ends of the magnetoresistive element 1 is measured. A check is then made to determine whether the magnetization direction of the storage layer 2 is parallel to the magnetization direction of the interfacial magnetic layer 5, or whether the magnetization direction of the storage layer 2 is antiparallel to the magnetization direction of the interfacial magnetic layer 5. If the magnetization direction of the storage layer 2 is parallel to the magnetization of the interfacial magnetic layer 5, the electrical resistance at both ends of the magnetoresistive element 1 is low. If the magnetization direction of the storage layer 2 is antiparallel to the magnetization direction of the interfacial magnetic layer 5, the electrical resistance at both ends of the magnetoresistive element 1 is high.

Second Embodiment

Figure 3:
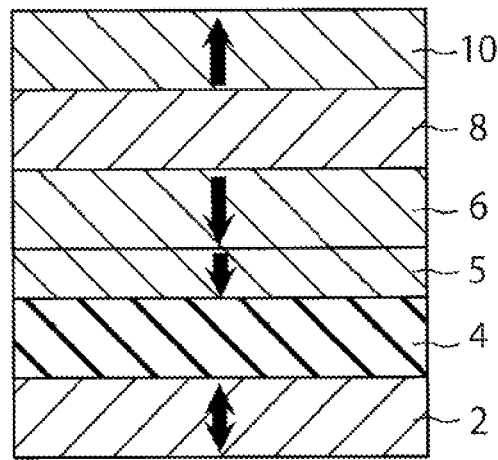
FIG. 3 is a cross-sectional view of a magnetoresistive element according to a second embodiment.

FIG. 3 shows a cross-section of a magnetoresistive element according to a second embodiment. This magnetoresistive element 16 of the second embodiment has the same structure as the magnetoresistive element 1 of the first embodiment shown in FIG. 1, except that the functional layer 7 interposed between the interfacial magnetic layer 5 and the reference layer 6 is removed. That is, in this structure, the interfacial magnetic layer 5 and the reference layer 6 are in direct contact with each other.

The magnetoresistive element 16 of the second embodiment shown in FIG. 3 has a structure in which the storage layer 2, the nonmagnetic layer 4, the interfacial magnetic layer 5, the reference layer 6, the antiferromagnetic coupling layer 8, and the shift adjustment layer 10 are stacked in this order. However, the layers may be stacked in the reverse order as in the modification of the first embodiment. That is, the shift adjustment layer 10, the antiferromagnetic coupling layer 8, the reference layer 6, the interfacial magnetic layer 5, the nonmagnetic layer 4, and the storage layer 2 may be stacked in this order.

Third Embodiment

Figure 4:
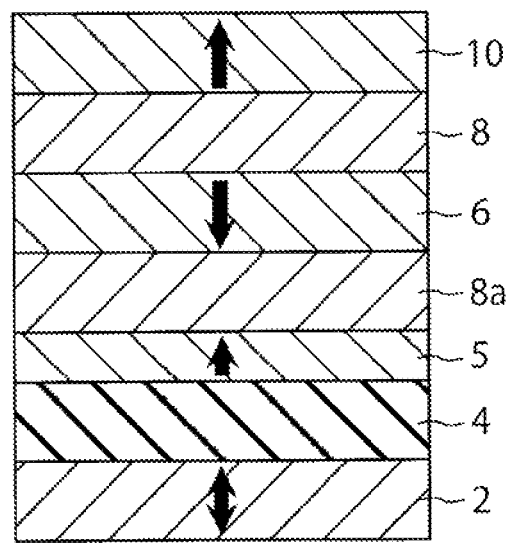
FIG. 4 is a cross-sectional view of a magnetoresistive element according to a third embodiment.

FIG. 4 shows a cross-section of a magnetoresistive element according to a third embodiment. This magnetoresistive element 1C of the third embodiment has the same structure as the magnetoresistive element 1 of the first embodiment shown in FIG. 1, except that an antiferromagnetic coupling layer 8a, instead of the functional layer 7, is interposed between the interfacial magnetic layer 5 and the reference layer 6, and the magnetization directions of the interfacial magnetic layer 5 and the reference layer 6 are coupled in an antiparallel manner by the antiferromagnetic coupling layer 8a.

As the magnetization directions of the interfacial magnetic layer 5 and the reference layer 6 are coupled in an antiparallel manner by the antiferromagnetic coupling layer 8a, the difference between the magnetic field leakage from the interfacial magnetic layer 5 and the magnetic field leakage from the reference layer 6 can be cancelled by the shift adjustment layer 10. Thus, the leakage magnetic field to be applied to the storage layer 2 can be reduced. As the leakage magnetic field to be applied to the storage layer 2 is reduced in this manner, the shift adjustment layer 10 having a reduced thickness can cancel the leakage magnetic field to be applied to the storage layer 2, and the film thickness to be handled in manufacturing the magnetoresistive element can be advantageously reduced. The antiferromagnetic coupling layer 8a can be formed with the same material as that of the antiferromagnetic coupling layer 8 described in the first embodiment.

The magnetoresistive element 1C of the third embodiment shown in FIG. 4 has a structure in which the storage layer 2, the nonmagnetic layer 4, the interfacial magnetic layer 5, the antiferromagnetic coupling layer 8a, the reference layer 6, the antiferromagnetic coupling layer 8, and the shift adjustment layer 10 are stacked in this order. However, the layers may be stacked in the reverse order as in the modification of the first embodiment. That is, the shift adjustment layer 10, the antiferromagnetic coupling layer 8, the reference layer 6, the antiferromagnetic coupling layer 8a, the interfacial magnetic layer 5, the nonmagnetic layer 4, and the storage layer 2 may be stacked in this order.

Fourth Embodiment

Figure 5:
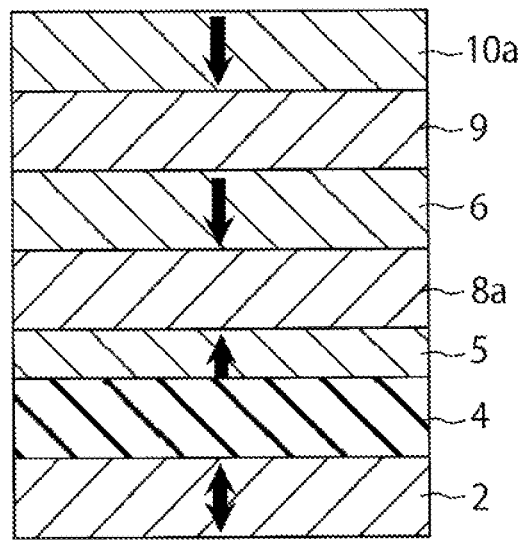
FIG. 5 is a cross-sectional view of a magnetoresistive element according to a fourth embodiment.

FIG. 5 shows a cross-section of a magnetoresistive element according to a fourth embodiment. This magnetoresistive element 1D of the fourth embodiment has the same structure as the magnetoresistive element 1C of the third embodiment shown in FIG. 4, except that the shift adjustment layer 10 is replaced with a shift adjustment layer 10a having the same magnetization direction as that of the reference layer 6, and an interfacial layer 9, instead of the antiferromagnetic coupling layer 8, is interposed between the reference layer 6 and the shift adjustment layer 10a. In this structure, the magnetization directions of the shift adjustment layer 10a and the reference layer 6 are parallel to each other via the interfacial layer 9, and the magnetic layers of the shift adjustment layer 10a and the reference layer 6 are antiparallel to the magnetization direction of the interfacial magnetic layer 5. In this case, the difference between the magnetic field leakage from the interfacial magnetic layer 5 and the magnetic field leakage from the reference layer 6 can be cancelled by the shift adjustment layer 10a, as in the third embodiment. In a case where the amount of magnetic field leakage from the interfacial magnetic layer 5 is larger than the amount of magnetic field leakage from the reference layer 6, the magnetization directions of the shift adjustment layer 10a and the reference layer 6 are made parallel to each other, to reduce the leakage magnetic field to be applied to the storage layer 2. In this case, the interfacial layer 9 is formed with a nonmagnetic material (such as Al, Sc, V, Cr, Zn, Ag, Zr, Nb, Mo, Hf, Ta, or W) that does not cause antiferromagnetic coupling, a metal material (such as Ru, Ir, or Pt) having its thickness adjusted so as not to cause antiferromagnetic coupling, a nitride material (such as AlN, TiN, or VN), or the like.

The magnetoresistive element 1D of the fourth embodiment shown in FIG. 5 has a structure in which the storage layer 2, the nonmagnetic layer 4, the interfacial magnetic layer 5, the antiferromagnetic coupling layer 8a, the reference layer 6, the interfacial layer 9, and the shift adjustment layer 10a are stacked in this order. However, the layers may be stacked in the reverse order as in the modification of the first embodiment. That is, the shift adjustment layer 10a, the interfacial layer 9, the reference layer 6, the antiferromagnetic coupling layer 8a, the interfacial magnetic layer 5, the nonmagnetic layer 4, and the storage layer 2 may be stacked in this order.

Fifth Embodiment

Figure 6:
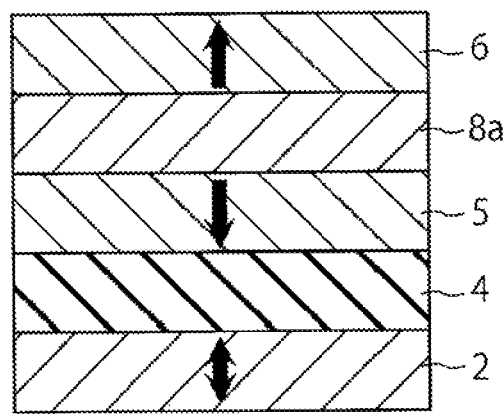
FIG. 6 is a cross-sectional view of a magnetoresistive element according to a fifth embodiment.

FIG. 6 shows a cross-section of a magnetoresistive element according to a fifth embodiment. This magnetoresistive element 1E of the fifth embodiment has the same structure as the magnetoresistive element 1D of the fourth embodiment shown in FIG. 5, except that the interfacial layer 9 and the shift adjustment layer 10a are removed. In this case, the saturation magnetizations of the interfacial magnetic layer 5 and the reference layer 6 are adjusted so that the magnetization directions are coupled in an antiparallel manner, and the leakage magnetic field can be cancelled. Because of this, the shift adjustment layer 10a becomes unnecessary. Along with this, the interfacial layer 9 also becomes unnecessary. As the interfacial layer 9 and the shift adjustment layer 10a become unnecessary, the film thickness to be handled in manufacturing the magnetoresistive element can be dramatically reduced. Thus, a smaller device size that contributes to an increase in capacity can be easily achieved.

The magnetoresistive element 1E of the fifth embodiment shown in FIG. 6 has a structure in which the storage layer 2, the nonmagnetic layer 4, the interfacial magnetic layer 5, the antiferromagnetic coupling layer 8a, and the reference layer 6 are stacked in this order. However, the layers may be stacked in the reverse order as in the modification of the first embodiment. That is, the reference layer 6, the antiferromagnetic coupling layer 8a, the interfacial magnetic layer 5, the nonmagnetic layer 4, and the storage layer 2 may be stacked in this order.

(Reference Layer 6)

Next, the reference layer 6 that is used in the first through fifth embodiments and modifications thereof is described in detail.

The reference layer of each of the magnetoresistive elements according to the above described embodiments and the modifications thereof is normally formed with an alloy (such as CoPt) of at least one element selected from a group of magnetic transition elements (the group consisting of Mn, Fe, Co, or Ni) and at least one element selected from a group of noble metal elements (the group consisting of Ru, Rh, Pd, Ag, Os, Ir, Pt, or Au), for example.

However, to reduce the leakage magnetic field to be applied to the storage layer, a lower saturation magnetization Ms is preferably achieved. According to a generally-known method for lowering the saturation magnetization of the reference layer, an antiferromagnetic coupling layer of Ru or the like is inserted between two magnetic layers so that the magnetization directions of the two magnetic layers are coupled in an antiparallel manner. However, the interlayer exchange coupling force acting on the two magnetic layers according to this method is not so large, and the magnetizations of the two magnetic layers change from an antiparallel state to a parallel state in the presence of an external magnetic field of several kOe. Therefore, this method is not suitable for lowering the saturation magnetization Ms of the reference layer. For the above reason, there is a demand for a method of achieving sufficient magnetic coupling in the reference layer while lowering the saturation magnetization of the reference layer. In view of this, the inventors conducted the various experiments described below.

Figure 7A:
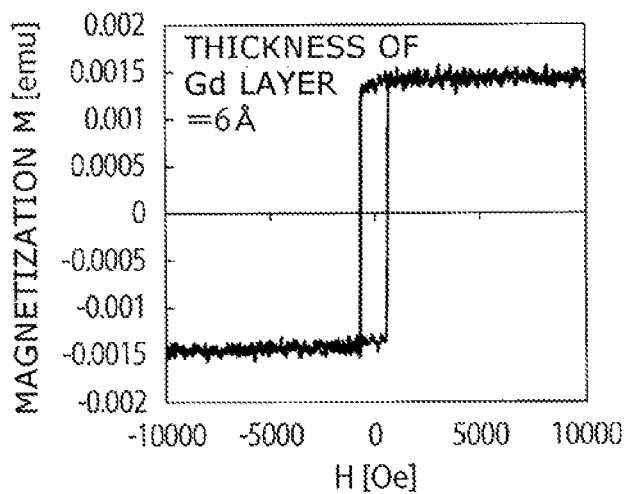
FIG. 7A is a graph showing the magnetization curve of a stack structure in which a Gd layer of 6 angstroms in thickness is inserted between two CoPt magnetic layers.
Figure 7B:
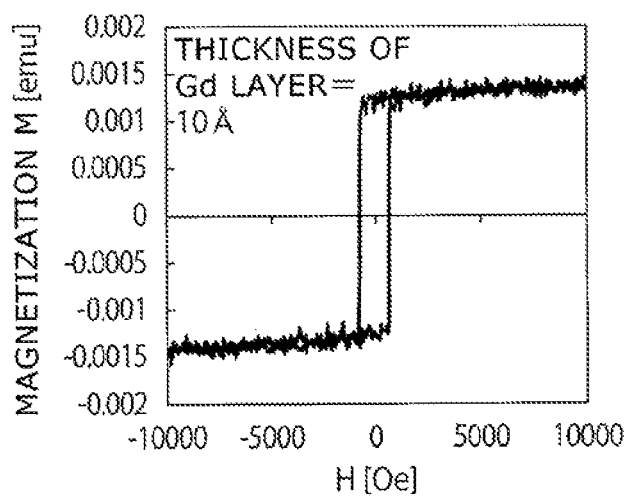
FIG. 7B is a graph showing the magnetization curve of a stack structure in which a Gd layer of 10 angstroms in thickness is inserted between two CoPt magnetic layers.
Figure 7C:
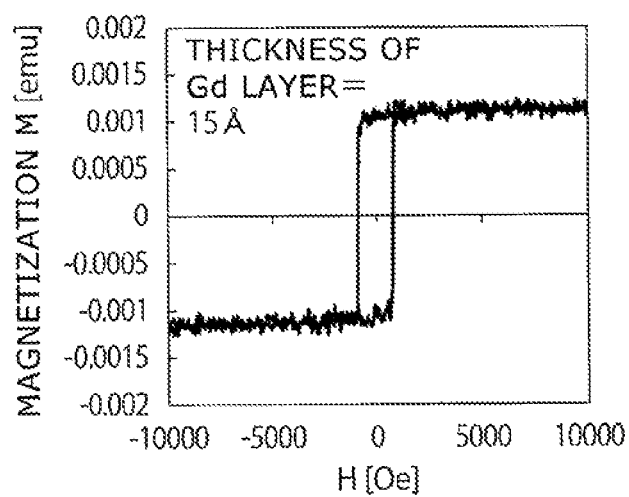
FIG. 7C is a graph showing the magnetization curve of a stack structure in which a Gd layer of 15 angstroms in thickness is inserted between two CoPt magnetic layers.

First, three kinds of CoPt/Gd/CoPt stack structures were prepared. In each of the stack structures, a Gd layer that is, a heavy rare-earth element layer and has a different thickness is inserted between a CoPt magnetic layer of 18 angstroms in thickness and another CoPt magnetic layer of 18 angstroms in thickness. In the prepared three kinds of stack structures, the thicknesses of the Gd layers are 6 angstroms, 10 angstroms, and 15 angstroms. FIGS. 7A, 7B, and 7C show the magnetization curves of these three kinds of stack structures. In each graph, the abscissa axis indicates the thickness of the Gd layer, and the ordinate axis indicates the magnetization M (emu/cc) of the stack structure.

As can be seen from FIGS. 7A, 7B, and 7C, even when an external magnetic field of 10 kOe is applied, there are no steps that would appear and indicate increases and decreases in the magnetization M if there are changes in the relationship between the magnetization directions of the upper and lower CoPt layers, regardless of the thickness of the Gd layer. This means that a stack structure formed with CoPt/Gd/CoPt behaves as a magnetic film, and the two CoPt layers are magnetically coupled with each other tightly via the Gd layer.

Figure 8:
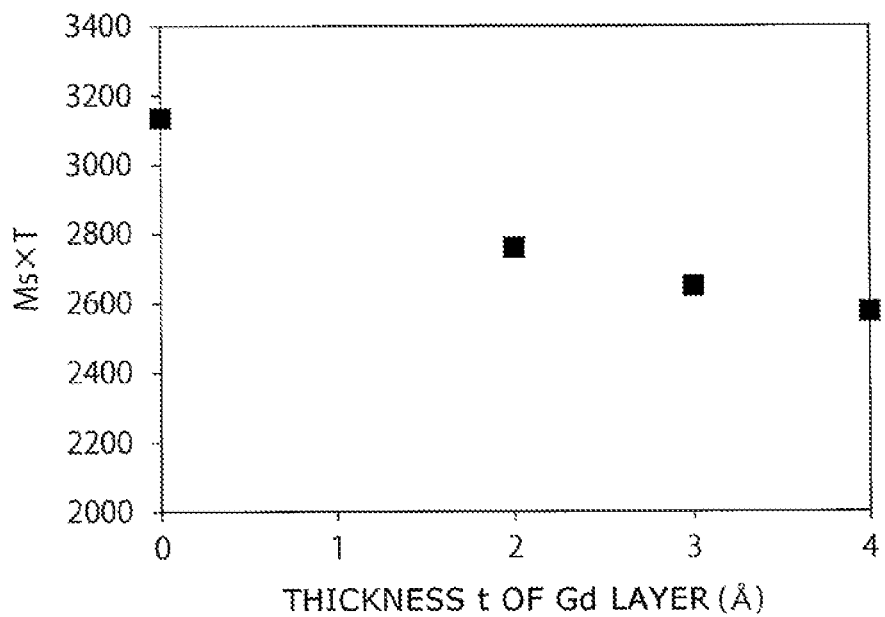
FIG. 8 is a graph showing the relationship between Ms×T and the thickness of the Gd layer in a stack structure formed by stacking [CoPt/Gd] three times.

Next, a film stack formed as one unit with a CoPt layer of 18 angstroms in thickness and a Gd layer of t angstroms in thickness [CoPt (18 angst)/Gd (t angst)] is repeatedly prepared three times, and thus, a stack structure is formed. Four stack structures among which the thickness t of the Gd layer is 0, 2, 3, and 4 angstroms were prepared, with the thickness t of the Gd layer in each stack structure being uniform, FIG. 8 shows the result of measurement of the relationship between the thickness t of the Gd layer and the product of the saturation magnetization Ms (emu/cc) of each of the four stack structures and the thickness T (angst) of each of the four stack structures (the product will be hereinafter referred to as Ms×T). Here, Ms×T is the value indicating the amount of magnetization of all the magnetic films. As can be seen from FIG. 8, Ms×T decreases with increase in the thickness t of the Gd layer.

As can be seen from the experiment results shown in FIGS. 7A through 8, in a case where a Gd layer is inserted between two CoPt magnetic layers, the magnetic coupling is tighter, and the decrease in magnetization is larger than in a case where a Ru layer is inserted between two CoPt magnetic layers.

Figure 9:
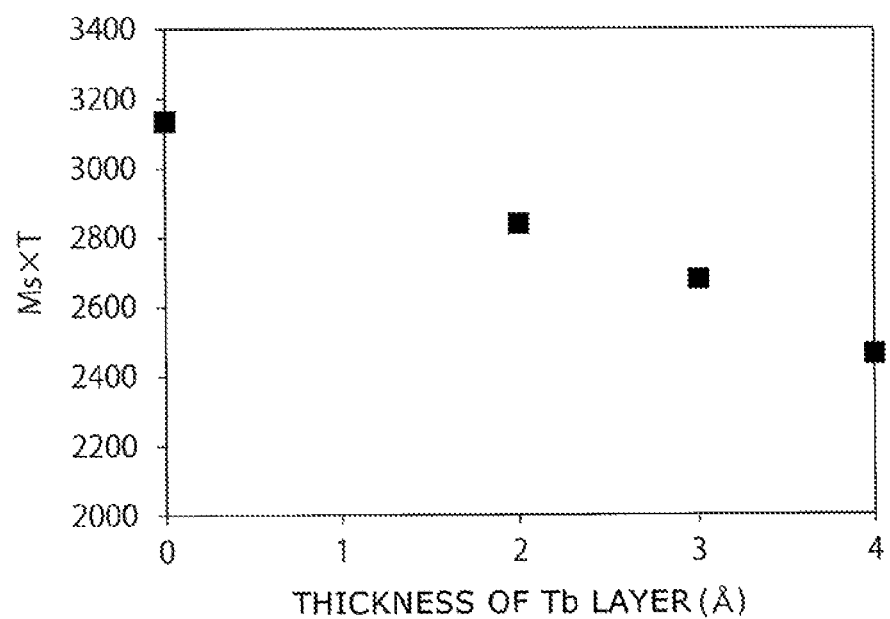
FIG. 9 is a graph showing the dependence of Ms×T on the thickness of the Tb layer in a stack structure formed by stacking [CoPt/Tb] three times.

Next, a film stack formed as one unit with a CoPt layer of 18 angstroms in thickness and a Tb layer of t angstroms in thickness [CoPt (18 angst)/Tb (t angst)] is repeatedly prepared three times, and thus, a stack structure is formed. Four stack structures among which the thickness t of the Tb layer is 0, 2, 3, and 4 angstroms were prepared, with the thickness t of the Tb layer in each stack structure being uniform. FIG. 9 shows the result of measurement of the relationship between the thickness t (angst) of the Tb layer and the product of the saturation magnetization Ms (emu/cc) of each of the four stack structures and the thickness T of each of the four stack structures (the product will be hereinafter referred to as Ms×T). As can be seen from FIG. 9, in a case where a Tb layer is inserted, Ms×T decreases with increase in the thickness t of the Tb layer, as in a case where a Gd layer is inserted. This means that, in a case where a Tb layer is inserted, the same effects as those with a Gd layer can be achieved.

A possible reason that Ms×T decreases with increase in the thickness of the inserted Gd layer or Tb layer as indicated by the experiment results shown in FIGS. 7A through 9 is described below.

Like Gd or Tb, a heavy rare-earth element (Eu, Gd, Tb, Dy, Ho, Er, Tm, Yb, or Lu) naturally forms ferri coupling with a magnetic transition element (Mn, Fe, Co, or Ni). Because of this, the same results as above are probably obtained in a case where a heavy rare-earth element other than Gd and Tb is used. Also, Ms×T decreases with increase in the thickness t of the Gd or Tb layer, probably because the portion ferri-coupled with CoPt becomes larger.

As described above, to form tight magnetic coupling and lower the saturation magnetization Ms of the reference layer 6 to be used in the first through fifth embodiments, it is preferable to form the reference layer 6 with a magnetic material that contains at least one element selected from a group of magnetic transition elements (the group consisting of Mn, Fe, Co, or Ni), at least one element selected from a group of noble metal elements (the group consisting of Ru, Rh, Pd, Ag, Os, Ir, Pt, or Au), and at least one element selected from a group of heavy rare-earth elements (the group consisting of Eu, Gd, Tb, Dy, Ho, Er, Tm, Yb, or Lu).

Also, as can be seen from FIG. 10, which will be described later, to lower the saturation magnetization Ms of the reference layer 6, it is also preferable to form the reference layer 6 with a stack structure that includes a first layer and a second layer, the first layer containing at least one element selected from a group of magnetic transition elements (the group consisting of Mn, Fe, Co, or Ni) and at least one element selected from a group of noble metal elements (the group consisting of Ru, Rh, Pd, Ag, Os, Ir, Pt, or Au), the second layer containing at least one element selected from a group of heavy rare-earth elements (the group consisting of Eu, Gd, Tb, Dy, Ho, Er, Tm, Yb, or Lu). The second layer may be a single layer formed at least one element selected from the group of heavy rare-earth elements.

(Functional Layer 7)

Next, the functional layer 7 that is used in the first embodiment is described in detail.

Figure 10:
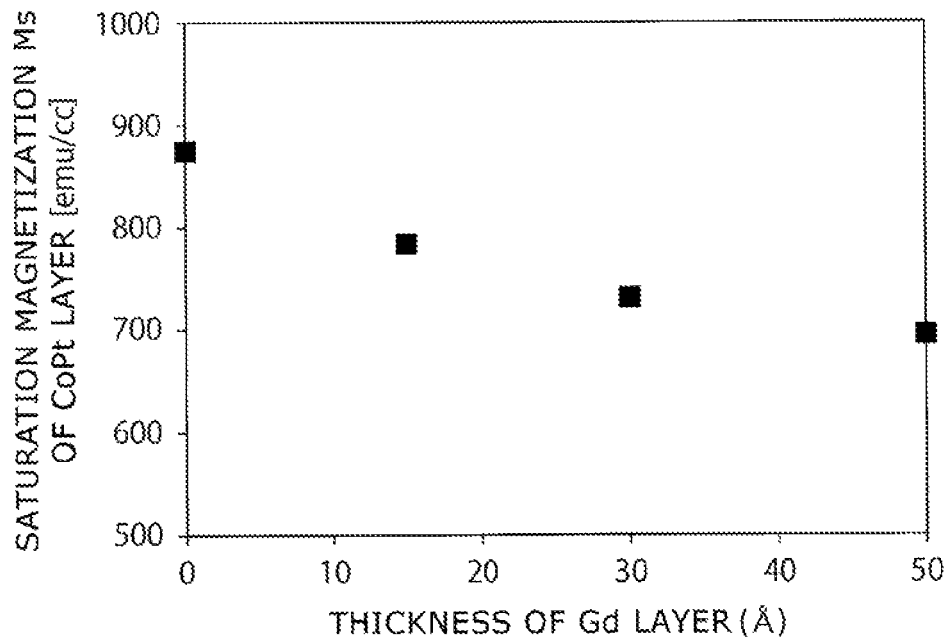
FIG. 10 is a graph showing the relationship between Ms of the CoPt layer and the thickness of the Gd layer in a Gd/CoPt film stack.

FIG. 10 shows the results of measurement of the relationship between the saturation magnetization Ms (emu/cc) of a CoPt layer and the thickness (angst) of a Gd layer in cases where a Gd layer having various thicknesses (0, 15, 30, and 50 angstroms) is formed on a CoPt layer. As can be seen from FIG. 10, the saturation magnetization Ms of the CoPt layer decreases with increase in the thickness of the Gd layer. FIGS. 7A through 8 show the effect to reduce Ms×T by inserting a Gd layer between two CoPt layers. Meanwhile, FIG. 10 shows the effect to lower the saturation magnetization Ms of a CoPt layer simply by disposing a CoPt layer and a Gd layer adjacent to each other.

Figure 11:
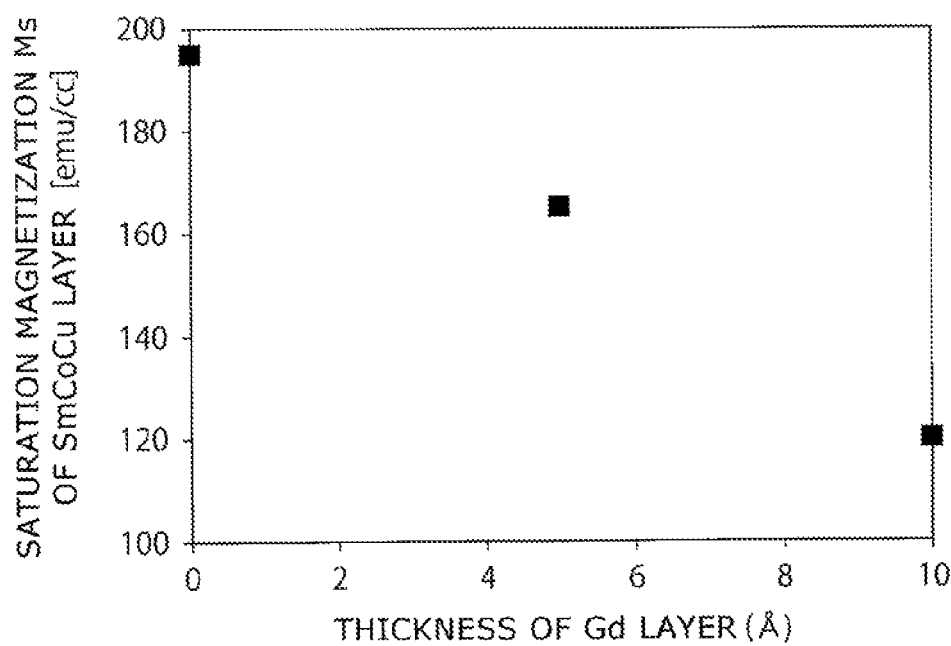
FIG. 11 is a graph showing the relationship between Ms of the SmCoCu layer and the thickness of the Gd layer in a SmCoCu/Gd/Ta film stack.

Next, Gd films with various thicknesses (0, 5, and 10 angstroms) were formed on a foundation layer that is made of Ta and is 30 angstroms in thickness, and a SmCoCu layer of 200 angstroms in thickness is formed on each of the Gd layers. FIG. 11 shows the results of measurement of the relationship between the saturation magnetization Ms of the SmCoCu layer and the Gd layer in this case. Here, the SmCoCu layer is used as the magnetic material of the reference layer, together with the functional layer 7. The reference layer formed with SmCoCu is an example of a magnetic material containing at least one element selected from a group of magnetic transition elements (the group consisting of Mn, Fe, Co, or Ni), at least one element selected from a group of rare-earth elements (the group consisting of Y, La, Ce, Pr, Nd, Sm, Eu, Gd, Tb, Dy, Ho, Er, Tm, Yb, or Lu), and at least one element selected from a group of nonmagnetic elements (the group consisting of B, C, Mg, Al, Sc, Ti, Cu, or Zn). The reference layer may be formed with any magnetic material containing elements selected from each of the above group of magnetic transition elements, the above group of rare-earth elements, and the above group of nonmagnetic elements (for example, see JP 2016-63150A, filed by the applicant).

The SmCoCu reference layers used in the example shown in FIGS. 12 and 13, which will be described later, are the same as the above reference layer formed with SmCoCu. As can be seen from FIG. 11, the saturation magnetization Ms of the SmCoCu layer decreases with increase in the thickness of the Gd layer. Like the experiment results shown in FIG. 10, FIG. 11 also indicates that it is possible to lower the saturation magnetization Ms of the SmCoCu layer simply by disposing a Gd layer adjacent to the SmCoCu layer. This is probably because any of the above heavy rare-earth elements and any of the above magnetic transition elements readily form ferri coupling. Although Gd layers were used in the experiments shown in FIGS. 10 and 11, the same results as those of the above described experiments can be achieved in a case where a layer containing at least one element selected from a group of heavy rare-earth elements (the group consisting of Eu, Gd, Tb, Dy, Ho, Er, Tm, Yb, or Lu) is disposed adjacent to the CoPt layer or the SmCoCu layer.

EXAMPLES

Example 1

Figure 12:
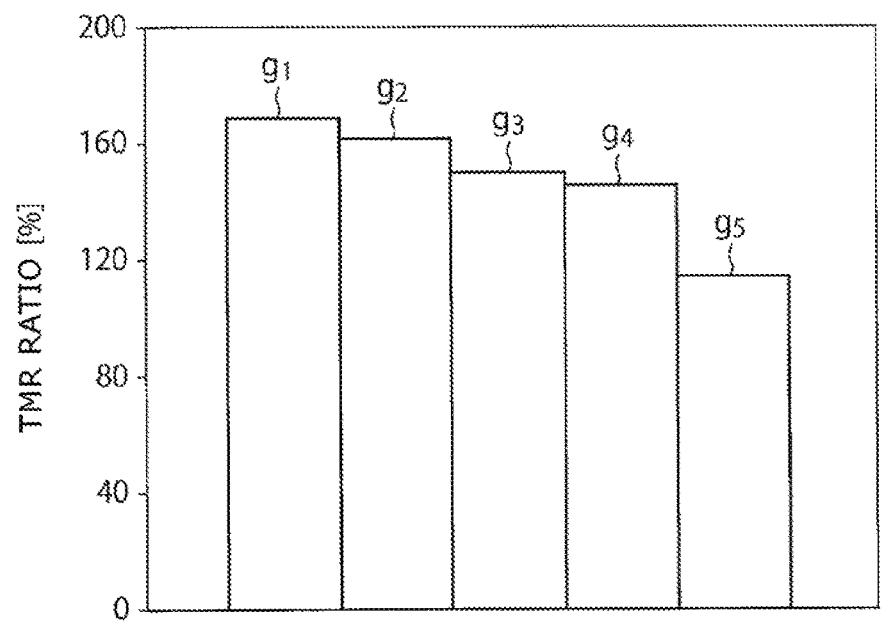
FIG. 12 is a graph showing comparisons among the tunneling magnetoresistive ratios of magnetoresistive elements according to Example 1 and a magnetoresistive element according to a reference example.

FIG. 12 shows the results of measurement of tunneling magnetoresistive ratios (hereinafter referred to as TMR ratios) of a magnetoresistive element according to Example 1 of the first embodiment shown in FIG. 1 and a magnetoresistive element as a reference example. In the magnetoresistive element of Example 1, CoFeB is used as the storage layer and the interfacial magnetic layer, MgO is used as the nonmagnetic layer, and SmCoCu is used as the reference layer. In the magnetoresistive element of the reference example, the reference layer is formed with CoPt, instead of SmCoCu used in the magnetoresistive element of Example 1.

In the magnetoresistive element using the SmCoCu reference layer, Ti, Ta, Ru, and Pt (each having a thickness of 3 angstroms) were used as materials for the functional layer to be inserted between the SmCoCu reference layer and the interfacial magnetic layer, and TMR ratios were measured. As can be seen from FIG. 12, in the case where a Ti layer is inserted as the functional layer (graph $g_2$), a TMR ratio close to that of the reference example (graph $g_1$) is obtained. In the cases where Ta and Ru were used as functional layers (graphs $g_3$ and $g_4$), the TMR ratios were slightly lower than those in the reference example and the case where the functional layer is formed with Ti (graphs $g_1$ and $g_2$), but preferable TMR ratios were obtained. In the case where the functional layer formed with Pt is used (graph $g_5$), however, the TMR ratio is much lower than those in the above cases.

A possible reason that the TMR ratios of magnetoresistive elements each using a SmCoCu reference layer greatly vary with the materials of the functional layers lies in the influence of degradation of the spin polarization rate or the like of the interfacial magnetic layer due to diffusion or the like of the rare-earth element (Sm in the example shown in FIG. 12), and in the influence of the oxygen extraction effect of the oxide tunnel barrier layer. That is, in a case where Ti is used as the functional layer, the crystal structure of Ti is a hexagonal crystal structure, and is similar to that of the reference layer formed with SmCoCu. Therefore, the crystal ordering of the reference layer formed with SmCoCu is facilitated and then stabilized. Accordingly, diffusion of the rare-earth element or the like forming the reference layer can be further reduced. For this reason, a TMR ratio almost equal to the TMR ratio in a case where the reference layer is not formed with SmCoCu can be obtained. Such an effect can also be expected in cases where a material having a hexagonal crystal structure, such as a material containing at least one element selected from the group consisting of Mg, Sc, Co, Zr, Hf, or Zn, is used, instead of Ti.

The reason that a preferable TMR ratio is obtained in the case where Ru is used as the functional layer (graph $g_4$) as shown in Example 1 in FIG. 12 is similar to the above reason, and are probably because the crystal structure of Ru is a hexagonal crystal structure.

Also, a possible reason that a preferable TMR ratio is obtained in the case where Ta is used as the functional layer (graph $g_3$) is that Ta is a material having a high melting point and is not easily crystallized. Ta has an amorphous or microcrystal structure. Therefore, Ta does not hinder the crystal ordering of the reference layer formed with SmCoCu, and the crystal structure is easily stabilized. Thus, diffusion of the elements forming the reference layer is reduced. This is considered an effect that is achieved because the cubic structure of the interfacial magnetic layer formed with CoFeB can be reset by the Ta functional layer. Such an effect can also be expected in cases where a material having a high melting point, such as a material containing at least one element selected from the group consisting of Nb, Mo, or W, is used, instead of Ta.

Example 2

Figure 13:
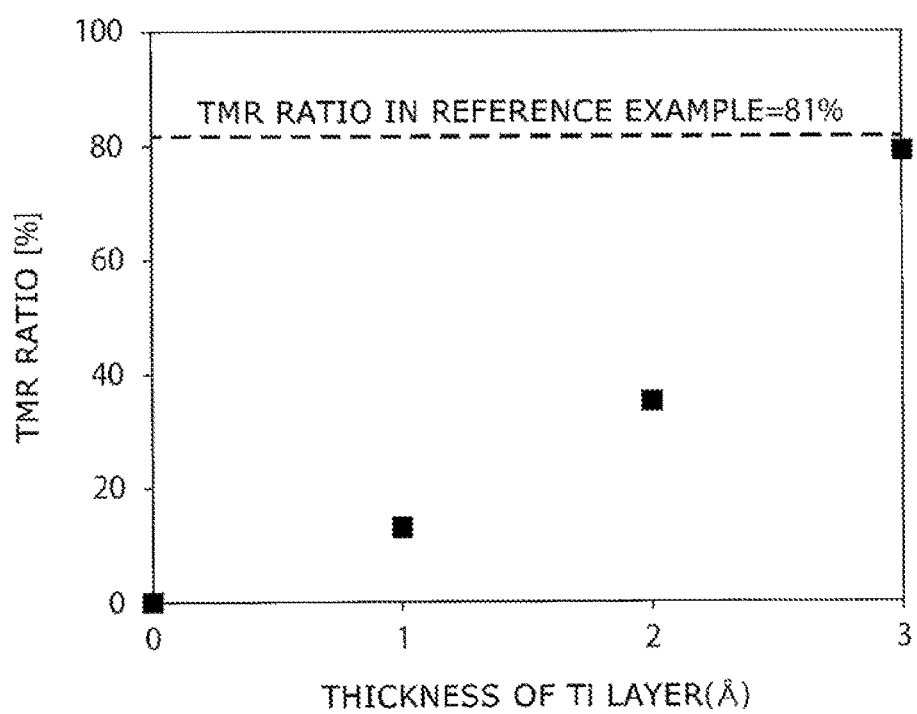
FIG. 13 is a graph showing the relationship between the thickness of the functional layer formed with Ti and the tunneling magnetoresistive ratio of a magnetoresistive element using a reference layer formed with SmCoCu.

FIG. 13 shows the results of measurement of the relationship between the thickness of the functional layer formed with Ti and the TMR ratio of a magnetoresistive element according to Example 2 of the first embodiment. In the magnetoresistive element of Example 2, a reference layer formed with SmCoCu is used. The difference from the magnetoresistive element including the reference layer formed with SmCoCu in Example 1 shown in FIG. 12 is that the interfacial magnetic layer formed with CoFeB is thinner. Therefore, the TMR ratios obtained in Example 2 shown in FIG. 13 are lower than those in Example 1 shown in FIG. 12. As can be seen from FIG. 13, the TMR ratio increases with increase in the thickness of the functional layer formed with Ti. Where the thickness of the functional layer formed with Ti is 3 angstroms, a TMR ratio almost equal to the TMR ratio of the magnetoresistive element of the reference example can be obtained. Therefore, in a case where a Ti functional layer is used as a single-layer functional layer, the thickness is equal to or greater than 3 angstroms, and the film thickness is preferably within such a range (greater than 0 angstroms but not greater than 20 angstroms, for example) that the magnetic coupling between the reference layer and the interfacial magnetic layer is not broken. The same applies not only in cases where Ti is used as the functional layer, but also to materials each having a hexagonal crystal structure described in Example 1 with reference to FIG. 12, such as a material containing at least one element selected from the group consisting of Mg, Sc, Co, Zr, Hf, or Zn, and a material having a high melting point such as a material containing at least one element selected from the group consisting of Nb, Mo, Ta, or W.

The above description of the functional layer 7 used in the first embodiment can be summed up as follows. To achieve a preferable TMR ratio while reducing the magnetic field leakage from the reference layer, the functional layer 7 is preferably formed with a single layer containing at least one element selected from a group of heavy rare-earth elements (the group consisting of Eu, Gd, Tb, Dy, Ho, Er, Tm, Yb, or Lu) that contribute to decreases in the magnetic field leakage, a single layer containing a metal element (a material having a hexagonal crystal structure (at least one element selected from the group consisting of Mg, Ti, Sc, Co, Zr, Hf, or Zn)) that contributes to increases in the TMR ratio, or a single layer containing a material having a high melting point such as at least one element selected from the group consisting of Nb, Mo, Ta, or W.

Alternatively, the functional layer 7 is preferably formed, with a stack structure that includes a first layer and a second layer, the first layer containing at least one element selected from the group consisting of Eu, Gd, Tb, Dy, Ho, Er, Tm, Yb, and Lu, the second group containing at least one element selected from the group consisting of Mg, Ti, Sc, Co, Zr, Hf, or Zn, or at least one element selected from the group consisting of Nb, Mo, Ta, or W. The first layer may be a single layer formed with at least one element selected from the group consisting of Eu, Gd, Tb, Dy, Ho, Er, Tm, Yb, or Lu.

In a magnetoresistive element using the above described functional layer 7, the reference layer is preferably formed with a magnetic material containing at least one element selected from the group consisting of Mn, Fe, Co, or Ni, Sm selected from a group of rare-earth elements, and at least one element selected from the group consisting of B, C, Mg, Al, Sc, Ti, Cu, or Zn.

Alternatively, the reference layer may contain at least one element selected from the group consisting of Y, La, Ce, Pr, Nd, Eu, Gd, Tb, Dy, Ho, Er, Tm, Yb, or Lu.

Sixth Embodiment

Figure 14:
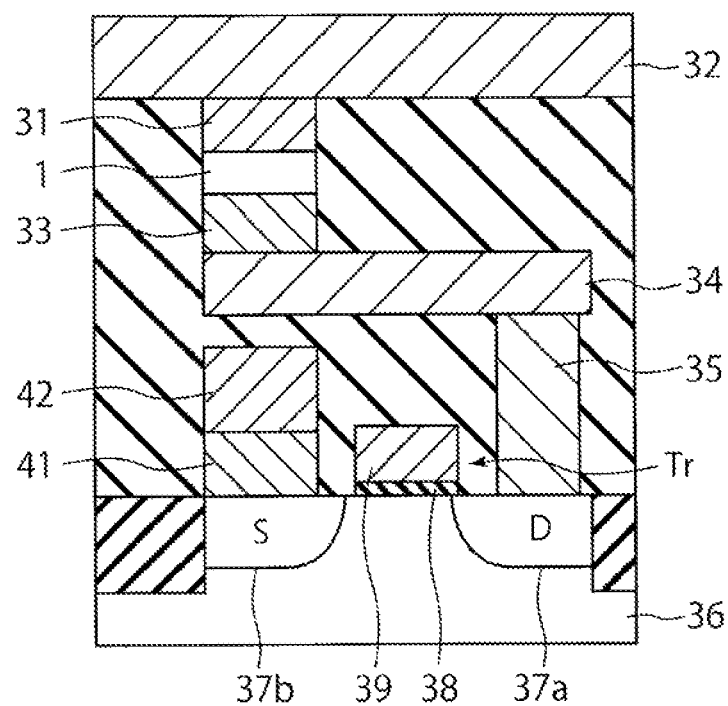
FIG. 14 is a cross-sectional view of a memory cell a magnetic memory according to a sixth embodiment.
Figure 15:
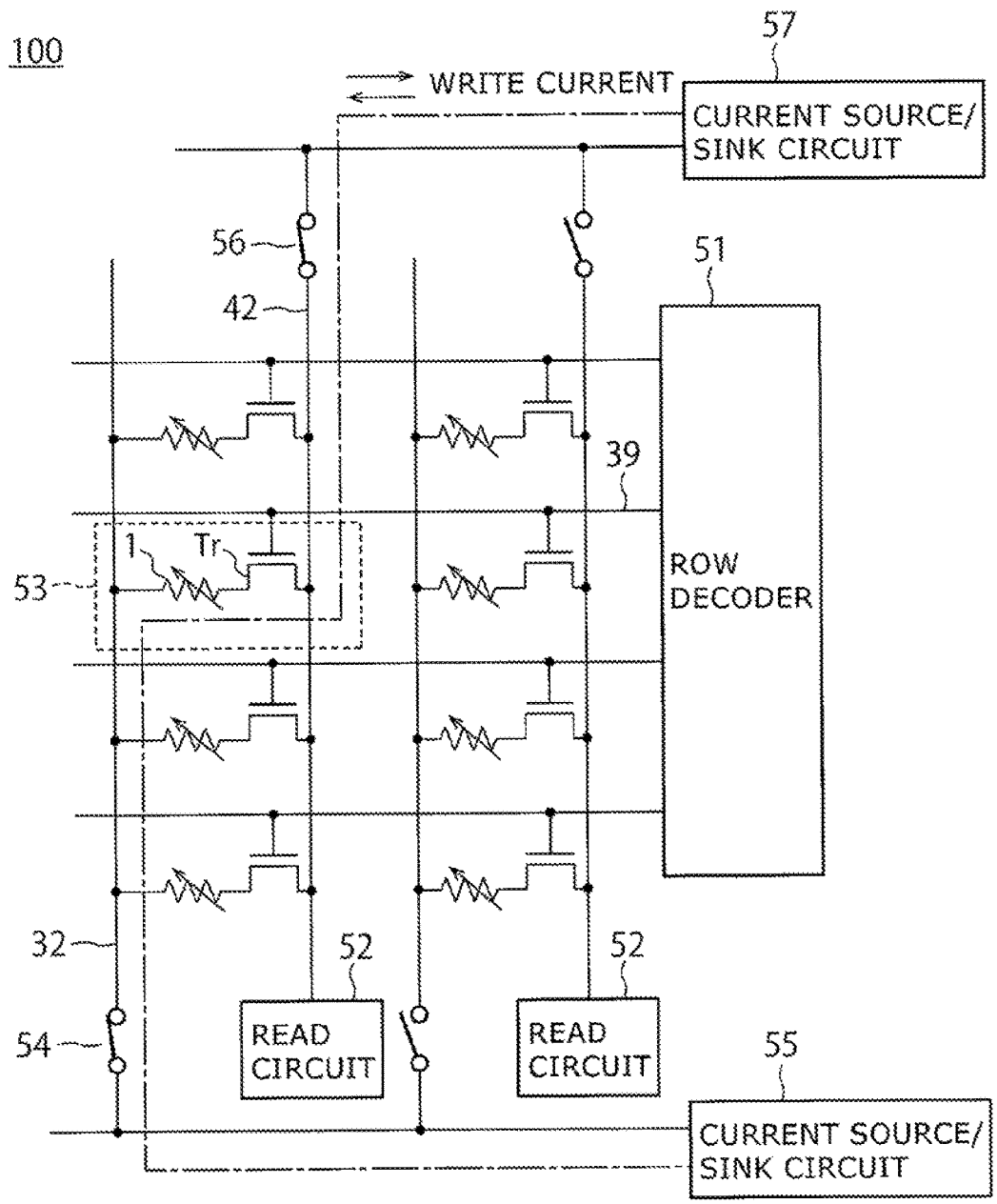
FIG. 15 is a circuit diagram of the magnetic memory according to the sixth embodiment.

Referring now to FIGS. 14 and 15, a magnetic memory according to a sixth embodiment is described. The magnetic memory of the sixth embodiment includes at least one memory cell. FIG. 14 is a cross-sectional view of this memory cell. The memory cell 53 includes a magnetoresistive element (MTJ element) of one of the first through fifth embodiments as the storage element. In the description below, the memory cell 53 includes the magnetoresistive element 1 of the first embodiment as the storage element.

As shown in FIG. 14, the upper surface of the magnetoresistive element (MTJ element) 1 is connected to a bit line 32 via an upper electrode 31. The lower surface of the MTJ element 1 is connected to a drain region 37a of source/drain regions (first and second terminals) in a surface of a semiconductor substrate 36, via a lower electrode 33, an extraction electrode 34, and a plug 35. The drain region 37a, a source region 37b, a gate insulating film 38 formed on the substrate 36, and a gate electrode 39 (a control terminal) formed on the gate insulating film 38 constitute a select transistor Tr. The select transistor Tr and the MTJ element 1 constitute one memory cell in the MRAM, The source region 37b is connected to another bit line 42 via a plug 41. Alternatively, the extraction electrode 34 may not be used, and the plug 35 may be provided under the lower electrode 33 so that the lower electrode 33 and the plug 35 are connected directly to each other. The bit lines 32 and 42, the electrodes 31 and 33, the extraction electrode 34, and the plugs 35 and 41 may be formed with an element among W, Al, AlCu, and Cu.

In the MRAM as the magnetic memory of this embodiment, memory cells 53, one of which is shown in FIG. 14, are arranged in a matrix, to form the memory cell array of the MRAM.

FIG. 15 is a circuit diagram of the magnetic memory 100 according to the sixth embodiment. As shown in FIG. 15, the memory cells 53 each including the MTJ element 1 and the select transistor Tr are arranged in a matrix. One terminal of each of the memory cells 53 belonging to the same column is connected to the same bit line 32, and the other terminal is connected to the same bit line 42. The gate electrodes of the select transistors Tr of the memory cells 53 belonging to the same row are connected to one another by a word line 39, and are further connected to a row decoder 51.

The bit lines 32 are connected to a current source/sink circuit 55 via a switch circuit 54 of a transistor or the like. Also, the bit lines 42 are connected to a current source/sink circuit 57 via a switch circuit 56 of a transistor or the like. The current source/sink circuits 55 and 57 supply a write current to the bit lines 32 and 42 connected thereto, or pull out the write current from the bit lines 32 and 42 connected thereto.

The bit lines 42 are also connected to read circuits 52. Alternatively, the read circuits 52 may be connected to the bit lines 32. The read circuits 52 each include a read current circuit and a sense amplifier.

At a time of writing, the switch circuits 54 and 56 connected to the write target memory cell, and the select transistor Tr are switched on, to form a current path via the write target memory cell. In accordance with the information to be written, one of the current source/sink circuits 55 and 57 functions as the current source, and the other one of the current source/sink circuits 55 and 57 functions as the current sink. As a result, the write current flows in the direction corresponding to the information to be written.

As for the write speed, spin-injection writing can be performed with a current having a pulse width from several nanoseconds to several microseconds.

At a time of reading, a read current that is so small as not to cause magnetization switching with the read circuit 52 is supplied to the MTJ element 1 designated in the same manner as in writing. The sense amplifier of the read circuit 52 then determines the resistance state of the MTJ element 1 by comparing the current value or the voltage value derived from the resistance value corresponding to the magnetization state of the MTJ element 1 with a reference value.

At a time of reading, the current pulse width is preferably smaller than that at a time of writing. With this, wrong writing with the read current can be reduced. This is based on the fact that a write current with a small pulse width leads to a write current value with a large absolute value.

As described so far, each embodiment can provide a magnetoresistive element that can reduce leakage magnetic fields, and a magnetic memory using the magnetoresistive element.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element, comprising:
    a first magnetic layer;
    a second magnetic layer comprising a first magnetization direction;
    a first nonmagnetic layer disposed between the first magnetic layer and the second magnetic layer;
    a third magnetic layer disposed between the first nonmagnetic layer and the second magnetic layer, the third magnetic layer comprising a second magnetization direction, the first magnetization direction being different from the second magnetization direction; and
    a metal layer disposed between the second magnetic layer and the third magnetic layer, wherein:

the metal layer is in direct contact with the second magnetic layer and the third magnetic layer;

the second magnetic layer includes a magnetic material including at least one element selected from a first group consisting of Mn, Fe, Co, and Ni, at least one element selected from a second group consisting of Y, La, Ce, Pr, Nd, Sm, Eu, Gd, Tb, Dy, Ho, Er, Tm, Yb, and Lu, and at least one element selected from a third group consisting of B, C, Mg, Al, Sc, Ti, Cu, and Zn; and the metal layer includes at least one element selected from the group consisting of Mg, Sc, Co, and Zn.

2. The magnetoresistive element according to claim 1, wherein the metal layer is a layer including the at least one element selected from the group consisting of Mg, Sc, Co, and Zn.

3. A magnetic memory, comprising:

the magnetoresistive element of claim 1;

a transistor including a first terminal, a second terminal, and a control terminal, the first terminal being electrically connected to one of the first magnetic layer and the second magnetic layer of the magnetoresistive element;

a first wiring electrically connected to the other of the first magnetic layer and the second magnetic layer of the magnetoresistive element;

a second wiring electrically connected to the second terminal; and a third wiring electrically connected to the control terminal.

4. The memory according to claim 3, further comprising: a first circuit configured to apply an voltage to the control terminal, and flow a write current between the second terminal and the other of the first and second magnetic layers, and a second circuit configured to flow a read current between the second terminal and the other of the first and second magnetic layers.

5. The memory according to claim 3, wherein the metal layer is a layer including the at least one element of selected from the group consisting Mg, Sc, Co, and Zn.

6. The magnetoresistive element according to claim 1, wherein the second magnetic layer includes Sm.

7. The magnetoresistive element according to claim 1, wherein the second magnetic layer includes Sm, Co, and Cu.

8. The magnetoresistive element according to claim 7, wherein the second magnetic layer further includes at least one element selected from a group consisting of Gd, Tb, and Dy.

* * * * *